United States Patent
Clark et al.

(10) Patent No.: US 6,856,217 B1
(45) Date of Patent: *Feb. 15, 2005

(54) MICROMECHANICAL RESONATOR DEVICE AND MICROMECHANICAL DEVICE UTILIZING SAME

(75) Inventors: John R. Clark, Novi, MI (US); Clark T.-C. Nguyen, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/660,332

(22) Filed: Sep. 11, 2003

Related U.S. Application Data

(63) Continuation of application No. 09/938,358, filed on Aug. 23, 2001, now Pat. No. 6,628,177.
(60) Provisional application No. 60/227,505, filed on Aug. 24, 2000, and provisional application No. 60/227,507, filed on Aug. 24, 2000.

(51) Int. Cl.[7] ............... H03H 9/24; H03H 9/50; H03H 9/05; H03H 9/125
(52) U.S. Cl. ............ 333/186; 333/197; 333/199; 310/309
(58) Field of Search ............... 333/186–192, 333/197–199; 310/309

(56) References Cited

U.S. PATENT DOCUMENTS

| | | | |
|---|---|---|---|
| 3,612,922 A | 10/1971 | Furnivale | 310/351 |
| 5,194,836 A | 3/1993 | Vale et al. | 333/133 |

(List continued on next page.)

FOREIGN PATENT DOCUMENTS

| | | | |
|---|---|---|---|
| WO | WO 96/37784 | * 11/1996 | |

OTHER PUBLICATIONS

Johnson, Robert A., et al., Mechanical Filters In Electronics, pp. v–379, California, Jan. 1983, John Wiley and Sons, New York.

(List continued on next page.)

*Primary Examiner*—Barbara Summons
(74) *Attorney, Agent, or Firm*—Brooks Kushman, P.C.

(57) ABSTRACT

A micromechanical resonator device and a micromechanical device utilizing same are disclosed based upon a radially or laterally vibrating disk structure and capable of vibrating at frequencies well past the GHz range. The center of the disk is a nodal point, so when the disk resonator is supported at its center, anchor dissipation to the substrate is minimized, allowing this design to retain high-Q at high frequency. In addition, this design retains high stiffness at high frequencies and so maximizes dynamic range. Furthermore, the sidewall surface area of this disk resonator is often larger than that attainable in previous flexural-mode resonator designs, allowing this disk design to achieve a smaller series motional resistance than its counterparts when using capacitive (or electrostatic) transduction at a given frequency. Capacitive detection is not required in this design, and piezoelectric, magnetostrictive, etc. detection are also possible. The frequency and dynamic range attainable by this resonator makes it applicable to high-Q RF filtering and oscillator applications in a wide variety of communication systems. Its size also makes it particularly suited for portable, wireless applications, where, if used in large numbers, such a resonator can greatly lower the power consumption, increase robustness, and extend the range of application of high performance wireless transceivers.

28 Claims, 5 Drawing Sheets

U.S. PATENT DOCUMENTS

| | | | | |
|---|---|---|---|---|
| 5,260,675 | A | 11/1993 | Ogawa et al. | 333/189 |
| 5,455,547 | A | 10/1995 | Lin et al. | 333/186 |
| 5,491,604 | A | 2/1996 | Nguyen et al. | 361/278 |
| 5,537,083 | A | 7/1996 | Lin et al. | 333/186 |
| 5,589,082 | A | 12/1996 | Lin et al. | 216/2 |
| 5,604,392 | A | 2/1997 | Vig | 310/309 |
| 5,839,062 | A | 11/1998 | Nguyen et al. | 455/323 |
| 5,955,932 | A | 9/1999 | Nguyen et al. | 333/186 |
| 5,996,409 | A | 12/1999 | Funk et al. | 73/504.04 |
| 6,111,338 | A | 8/2000 | Otsuchi et al. | 310/352 |
| 6,236,281 | B1 | 5/2001 | Nguyen et al. | 331/154 |
| 6,249,073 | B1 | 6/2001 | Nguyen et al. | 310/309 |
| 6,369,374 | B1 | 4/2002 | Greywall | 250/201.1 |
| 6,628,177 | B2 * | 9/2003 | Clark et al. | 333/186 |

OTHER PUBLICATIONS

T. Fujita et al., "Disk–Shaped Bulk Micromachined Gyroscope With Vacuum Sealing", Sensors and Actuators, 82, 2000, pp. 198–204, vol. 82, May 2000.

Goran Stemme, "Micro Fluid Sensors and Actuators", Sixth Int'l. Symposium on Micro Machine and Human Science, 1995, pp. 45–52, Oct. 1995.

C. T.–C. Nguyen, "Micromachining technologies for miniaturaiced communication devices," Proceedings of SPIE: Micromachining and Microfabrication, Sep., 20–22, 1998, pp. 24–38.

J. L. Davidson et al., "Diamond as an active sensor material," Diamond and Related Materials, 8, 1999, pp. 1741–1747, vol. 8, Aug. 1999.

C. T.–C. Nguyen, "Communications applications of microelectromechanical systems," Proceedings, 1998 Sensors Expo, May 19–21, 1998, pp. 447–455.

* cited by examiner

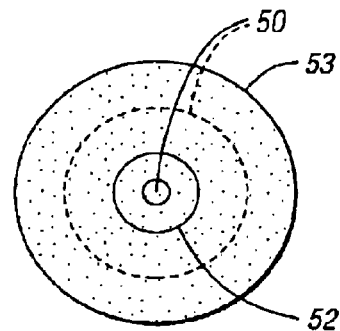
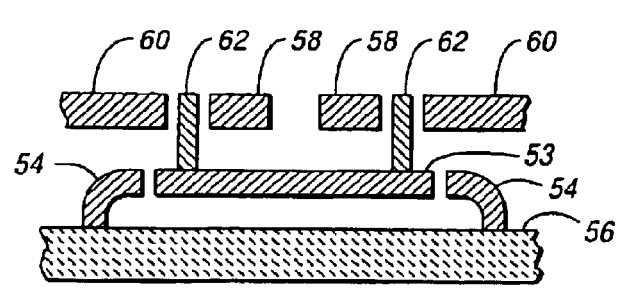
Fig. 5     Fig. 6
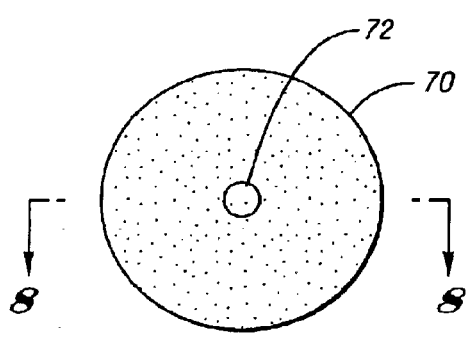
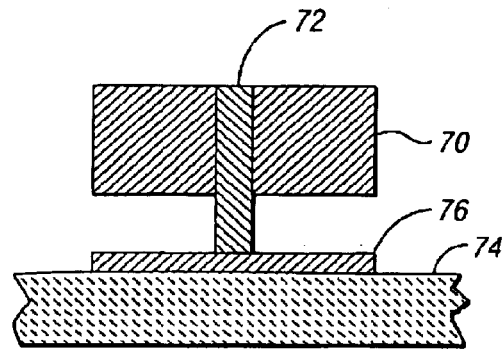
Fig. 7     Fig. 8
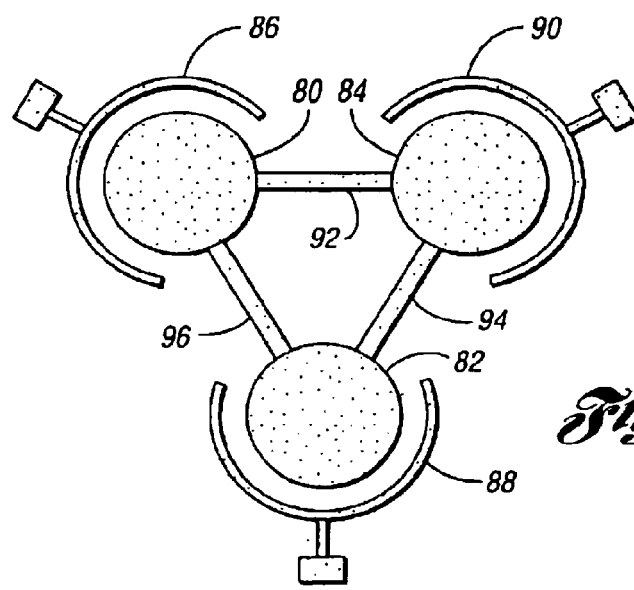
Fig. 9

US 6,856,217 B1

MICROMECHANICAL RESONATOR DEVICE AND MICROMECHANICAL DEVICE UTILIZING SAME

CROSS-REFERENCE TO RELATED APPLICATIONS

This application is a continuation of application Ser. No. 09/938,358 filed on Aug. 23, 2001, now U.S. Pat. No. 6,628,177 which claims the benefits of U.S. provisional patent applications Ser. No. 60/227,505 filed Aug. 24, 2000 and entitled "Micromechanical Disk Resonators" and Ser. No. 60/227,507 also filed Aug. 24, 2000 and entitled "Process Technology For Lateral Small-Gap Micromechanical Structures."

STATEMENT REGARDING FEDERALLY SPONSORED RESEARCH OR DEVELOPMENT

The invention was made with Government support under DARPA Contract No. F30602-97-2-0101. The Government has certain rights in the invention.

BACKGROUND OF THE INVENTION

1. Field of the Invention

This invention relates to micromechanical resonator devices and micromechanical devices utilizing same.

2. Background Art

Vibrating mechanical tank components, such as crystal and SAW resonators, are widely used for frequency selection in communication sub-systems because of their high quality factor (Q's in the tens of thousands) and exceptional stability against thermal variations and aging. In particular, the majority of heterodyning communication transceivers rely heavily upon the high-Q of SAW and bulk acoustic mechanical resonators to achieve adequate frequency selection in their RF and IF filtering stages and to realize the required low phase noise and stability in their local oscillators. In addition, discrete inductors and variable capacitors are used to properly tune and couple the front end sense and power amplifiers, and to implement widely tunable voltage-controlled oscillators. At present, the aforementioned resonators and discrete elements are off-chip components, and so must interface with integrated electronics at the board level, often consuming a sizable portion of the total sub-system area. In this respect, these devices pose an important bottleneck against the ultimate miniaturization and portability of wireless transceivers. For this reason, many research efforts have been focused upon strategies for either miniaturizing these components or eliminating the need for them altogether.

Recent demonstrations of micro-scale high-Q oscillators and mechanical bandpass filters with area dimensions on the order of 30 $\mu$m×20 $\mu$m now bring the first of the above strategies closer to reality. Such devices utilize high-Q, on-chip, micromechanical (abbreviated "$\mu$mechanical") resonators constructed in polycrystalline silicon using IC-compatible surface micromachining fabrication techniques, and featuring Q's of over 80,000 under vacuum and center frequency temperature coefficients in the range of −10 ppm/° C. (several times less with nulling techniques). To date, resonators based on freely-supported, vibrating prismatic beams have achieved frequencies of up to 92 MHz. For use in many portable communications applications, however, higher frequencies must be achieved and are thus important to the success of this technology.

Much like the case for transistors, extending the frequency of mechanical resonators generally entails scaling of resonator dimensions. Some of the previous VHF demonstrations with clamped—clamped boundary conditions actually used submicron dimensions to avoid Q-limiting anchor losses. Unfortunately, smaller size often coincides with smaller power handling and increased susceptibility to environmental effects, such as contamination or thermal fluctuations. Although recently demonstrated free—free beam $\mu$mechanical resonators have been able to achieve frequencies up to 92 MHz with Q's around 8,000 while avoiding submicron dimensions, as shown in U.S. Pat. No. 6,249,073, whether or not they can maintain their size and Q at UHF frequencies has yet to be seen.

SUMMARY OF THE INVENTION

An object of the present invention is to provide a micromechanical disk resonator and micromechanical device utilizing same.

In carrying out the above object and other objects of the present invention, a micromechanical resonator device having at least one mode shape is provided. The device includes a substrate and a disk-shaped resonator disposed above the substrate and having at least one nodal point.

The device may include a support structure anchored to the substrate to support the resonator at the at least one nodal point above the substrate. Both the resonator and the support structure are dimensioned and positioned relative to one another so that the resonator is substantially isolated during vibration thereof. Energy losses to the substrate are substantially eliminated and the resonator device is a high-Q resonator device.

The at least one mode shape may include a radial-contour mode shape and/or a flexural mode shape.

The device preferably further includes a drive electrode structure formed on the substrate at a position to allow electrostatic excitation of the resonator so that the resonator is driven in the at least one mode shape and the resonator and the drive electrode structure may define a capacitive gap, therebetween.

The drive electrode structure may be disposed about a periphery of the resonator and the at least one mode shape may include a radial-contour mode shape.

The capacitive gap is preferably a sub-micron, lateral, capacitive gap.

The drive electrode structure may include a plurality of split electrodes.

The device may have a single electrode which not only allows electrostatic excitation of the resonator, but also to sense output current based on motion of the resonator. Then the device has two terminals, one on the electrode, one on the resonator, and both are used for both driving and sensing.

The at least one nodal point may correspond to a center of the resonator and the support structure may be a single anchor positioned at the center of the resonator.

The device may further include a sense electrode structure formed on the substrate at a position to sense output current based on motion of the resonator.

The drive electrode structure may include a plurality of separate input drive electrodes and the sense electrode structure may include a plurality of separate output sense electrodes.

The drive electrode structure may be positioned beneath the resonator and the at least one mode shape may include a flexural mode shape.

The device may be diamond-based or silicon-based.

Further in carrying out the above object and other objects of the present invention, a micromechanical device is provided. The device includes a substrate, a disk-shaped input resonator disposed above the substrate and having at least one nodal point, and a disk-shaped output resonator disposed above the substrate and coupled to the input resonator and having at least one nodal point.

The device may also include support structures anchored to the substrate to support the input and output resonators at their respective nodal points above the substrate.

The micromechanical device may be a filter such as a bandpass filter or an integratable filter.

The resonators may be mechanically coupled together or electrically coupled together.

The device may further include a coupling spring for mechanically coupling the resonators together. The coupling spring can be an extension mode spring. Furthermore, the spring can also be flexural, or even combine two different types of modes (e.g., flexural or torsional).

The device may further include a drive electrode structure formed on the substrate at a position to allow electrostatic excitation of the input resonator and a sense electrode structure formed on the substrate at a position to sense output current based on motion of the output resonator.

The micromechanical disk resonators presented here have the potential to extend the frequency of micromechanical devices well into the GHz range, making them viable in all stages of wireless systems (including cellular phones) from the RF front-end down to IF filtering and mixing and enabling a completely integrated, single chip transceiver.

Disk resonators of the present invention have advantages over the freely supported and clamped—clamped beams used in previous HF designs, including the capability to reach UHF frequencies using low numbered mode shapes, typically leading to improved Q. In addition, their larger size at a given frequency improves their power handling capacity, making them more appropriate for RF front-ends where dynamic range is an important parameter. This size also leads to a larger electromechanical coupling area, which improves the series resistance of electrostatically-driven devices. The larger size also makes these devices easier to manufacture repeatedly (i.e., with repeatable frequency, etc.). The larger size also makes disk resonators less susceptible to "scaling-induced" degradation mechanisms, in the manner of contamination or thermal fluctuations.

This work presents an alternative, perhaps superior, design based on the radial contour mode, or areal dilation, of a $\mu$mechanical disk structure, and capable of attaining very high frequencies, while retaining relatively large dimensions. Using this disk design, a frequency of 156 MHz has been attained with a Q exceeding 9,400 and with a diameter of 34 $\mu$m—substantially larger than the 11.3 $\mu$m required to attain only 92 MHz in previous free—free beam resonators.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1b is a cross-sectional view of the disk resonator of FIG. 1a taken along lines 1b—1b in FIG. 1a;

FIG. 5 is a top plan schematic view of a disk-shaped resonator illustrating its node and anti-node portions;

FIG. 6 is a side elevational view, partially broken away and in cross-section, of a disk-shaped resonator including fins and a number of electrodes for sensing output of the resonator at its outer rim and the anti-node portion;

FIG. 7 is a top plan schematic view of another embodiment of the resonator device;

FIG. 8 is a sectional view taken along lines 8—8 of FIG. 7 of the device wherein the disk-shaped resonator and its support are made at the same time with different material;

FIG. 9 is a top plan schematic view of a bridged filter of the present invention;

DETAILED DESCRIPTION OF THE PREFERRED EMBODIMENTS

Figure 1A:
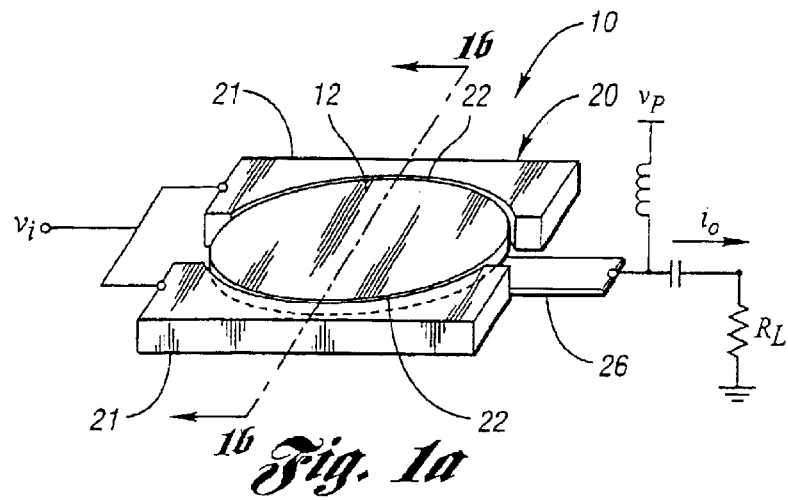
FIG. 1a is a combined electrical and perspective schematic view of a preferred embodiment of a disk resonator constructed in accordance with the present invention.
Figure 1B:
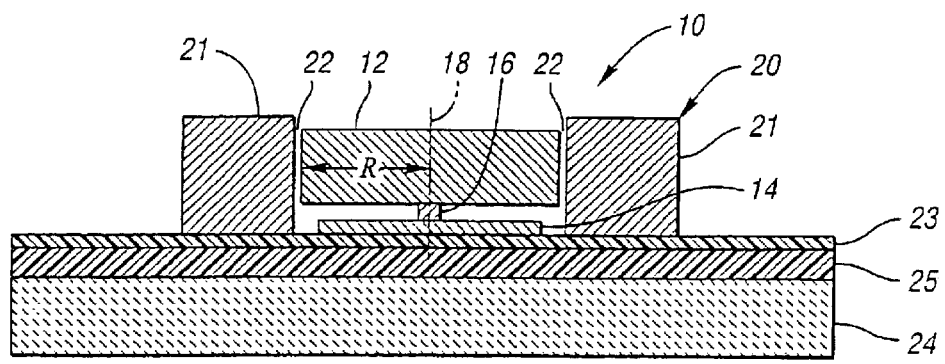

FIGS. 1a and 1b present a preferred embodiment of a micromechanical resonator device of the present invention, generally indicated at 10. In FIG. 1a, the perspective view shows the major features of the preferred embodiment. The resonator device 10 includes a disk 12 supported above a ground plane 14 and supported by a single anchor post 16 at its center 18. A drive electrode structure, generally indicated at 20, surrounds the perimeter of the disk 12, separated by a narrow air gap 22. The electrode structure 20 is split in half to form two input electrodes 21 in order to allow routing to the ground plane 14 and maintain symmetry. In this configuration, the resonator disk 12 is designed to move in a purely radial mode, expanding and contracting along its radius at resonance ideally with no motion perpendicular to a substrate 24 having isolation and passivation layers 23 and 25 or rotation around the anchor point or center 18. In this mode, the center 18 of the disk 12 is a nodal point, ideally devoid of any motion at resonance. Anchoring at the natural node, a very important part of this design, minimizes anchor dissipation to the substrate 24, greatly enhancing Q.

However, it is to be understood that the disk could alternatively be levitated either electrically or magnetically above the substrate wherein no physical or mechanical support is needed.

In order to operate the device 10, a DC bias voltage $V_P$ is applied to the structure, while an AC input signal, $V_i$, is applied to the electrodes 21, resulting in a time varying electrostatic force acting radially on the disk 12. When the input signal, and hence the force, is acting at the resonant frequency of the device 10, the response to that force is multiplied by the Q factor of the resonator device 10 and produces expansion and contraction of the disk 12 along its radius. This motion in turn results in a time-varying, DC-biased capacitor and generates an output current which can be measured through a sense or output electrode or structure 26 attached to the structure.

A cross-section of the device 10 is shown in FIG. 1b and more clearly illustrates the capacitive gap 22 and spacing above the ground plane 14 as well as the anchor 16. Preferably, the structural material of the disk 12 is polysilicon, but the structural material may include crystalline silicon, polydiamond, silicon carbide, and metals.

The current material of the drive electrode structure 20 is plated metal, but the invention includes other electrode materials as well.

The gaps 22 are preferably submicron, high-aspect ratio, lateral electrode-to-resonator gaps. Although 1000 Å lateral gaps have been achieved previously in μmechanical structures using e-beam lithography, this approach was found to be both time-consuming and costly. In addition, if impedances on the order of 50 Ω are desired, 1000 Å gaps may not be sufficient, and even smaller gaps on the order of 300 Å may in fact be desired. To avoid the limitations of lithography and dry etching, the fabrication technology described in detail hereinbelow with reference to FIGS. 10a-10e combines surface micromachining, metal electroplating, and a sacrificial sidewall spacer technique to achieve lateral polysilicon disk resonators with metal electrodes and submicron lateral electrode-to-resonator gaps, all without the need for aggressive lithographic or etching capability.

In general, the initial process steps are identical to those used in previous polysilicon surface micromachining processes to achieve a cross-section where a 2 μm-thick structural polysilicon layer, patterned to form the disk structure, is temporarily supported by a 5000 Å first sacrificial oxide layer. For example, and referring now to FIG. 10a, the process starts with a 2 μm thick oxide film 110 (i.e. $SiO_2$) thermally grown on a silicon substrate 112 and a 3000 Å thick film 114 of nitride (i.e. $Si_3N_4$) which together serve as an isolation layer. After a 3000 Å thick polysilicon layer 116 is deposited via LPCVD, doped via implantation or diffusion, and patterned via reactive ion etching (RIE), a 5000 Å thick layer 118 of sacrificial oxide (i.e. $SiO_2$) is deposited by LPCVD.

A via is patterned into the sacrificial oxide layer 118 by RIE, exposing the underlying polysilicon layer 116 in a specific area to later serve as the anchor 16 for the disk 12. A 2 μm thick structural layer 120 of low stress polysilicon is then deposited via LPCVD, doped via implantation or diffusion, and patterned also via RIE to form the disk 12 with straight side walls. An oxide mask is formed above the structure and used as a hard mask during etching.

Instead of releasing the structure at this point, as would be done in a conventional surface micromachining process, this process continues with the conformal deposition of 1000 Å of LPCVD oxide to cover the sidewalls of the structure and serve as the gap-defining sacrificial layer 122. Next, the sacrificial oxide and the underlying oxide are etched (RIE and wet etch) to open anchors to the passivation layers, and a thin metal seed layer 124 (i.e. Cr 200 Å/Au 300 Å/Cr 200 Å) is evaporated onto the wafer and removed (i.e. by wet etching) from the top and sides of the structure in order to prevent plating in these areas. A PR etchback is used to delineate the metal to be etched. A Ni-plating step is also provided to make seed layer removal easier.

Figure 10A:
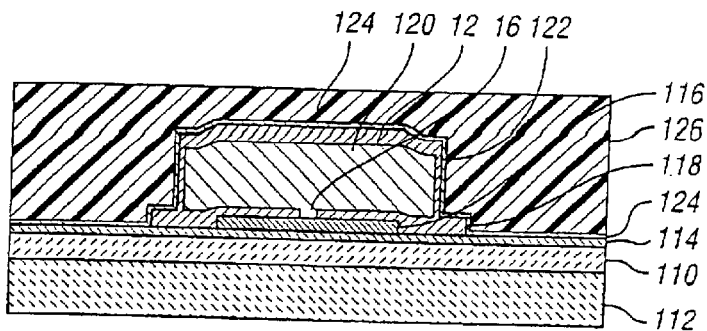
FIGS. 10a–10e are side schematic views illustrating micromechanical disk resonator fabrication.
Figure 10B:
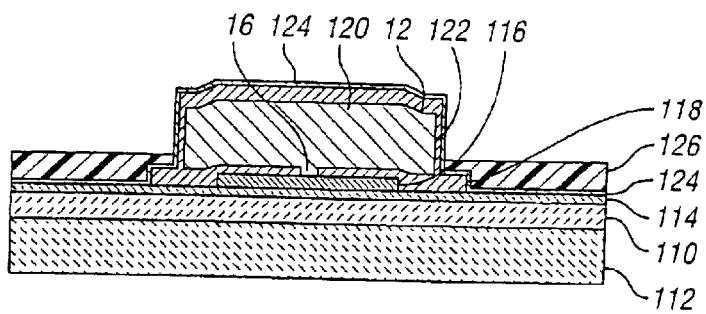
Figure 10C:
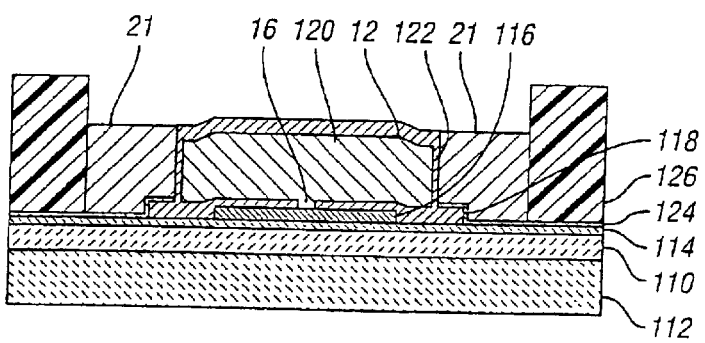
Figure 10D:
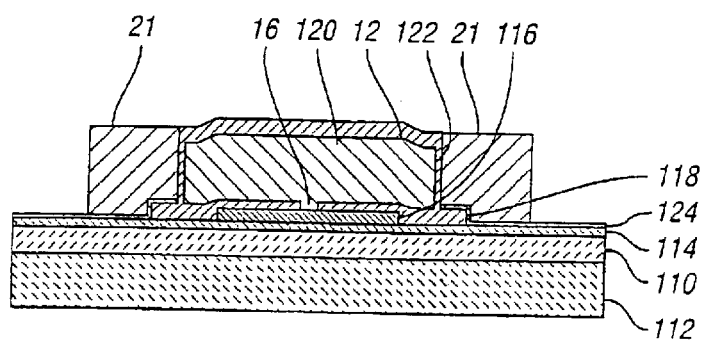
Figure 10E:
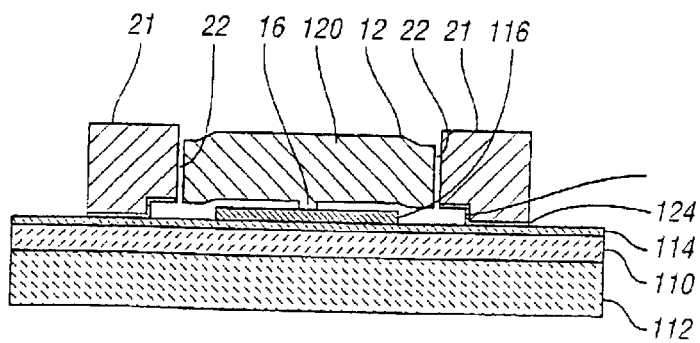

A thick photoresist (PR) mold 126 is then deposited by lithography and patterned, as shown in FIG. 10b, to define the electrodes 21. This is followed by plating of the electrodes 21, using the PR as one portion of the mold and the sidewall of the structure as the other, plating directly against the sacrificial layer 122, as shown in FIG. 10c. The PR 126 and seed layer 124 are then stripped, as shown in FIGS. 10c and 10d, and the structure is released in HF, as shown in FIG. 10e.

The result is the disk 12 suspended over the substrate 24 by a single anchor 16 in the middle, and separated from the plated electrodes 21 by thin air gaps 22 defined by the sacrificial layer. The minimum gap thickness in this process is limited only by the ability to control the thickness of a conformally deposited oxide film, and is independent of lithography and etching.

FIGS. 7 and 8 show an alternative embodiment wherein the disk-shaped resonator 70 and its support 72 thereunder are made at the same time with one mask to form a post 72 with the resonator 70 thereabout. The post 72 is made by filing it with a material such as polysilicon which may or may not be the same material as the resonator 70. The resulting structure is a self-aligned disk resonator 70 supported above a substrate 74 and a ground plane 76.

The frequency of the disk resonator device 10 is determined by the material properties of the disk 12 along with its radius. Neglecting some higher order effects, the resonant frequency of the disk 12 is given by $$f_0 = \frac{\alpha}{R}\sqrt{\frac{E}{\rho}} \qquad (1)$$

where α is a constant dependent on the Poisson's Ratio of the material (0.342 for polysilicon), E is the Young's Modulus of the material, p is its density, and R is the radius of the disk 12.

A more complex form of equation (1) is given by the following equations:

$$\zeta/\xi \times \frac{J_0(\zeta/\xi)}{J_1(\zeta/\xi)} = 1 - \sigma \qquad (2)$$

$$\zeta = 2\pi f_0 R \sqrt{\frac{\rho(2+2\sigma)}{E}} \qquad (3)$$

$$\xi = \sqrt{\frac{2}{1-\sigma}} \qquad (4)$$

Equations 2–4 allow the determination of higher modes as well as other modes such as "wine glass" mode.

The following table provides disk radii for various frequencies and modes.

| Frequency (MHz) Mode | 400 | 600 | 800 | 1000 |
| --- | --- | --- | --- | --- |
| First | 6.91μ | 4.60μ | 3.45μ | 2.76μ |
| Second | 18.15μ | 12.10μ | 9.08μ | 7.26μ |
| Third | 28.87μ | 19.25μ | 14.44μ | 11.55μ |

Figure 2:
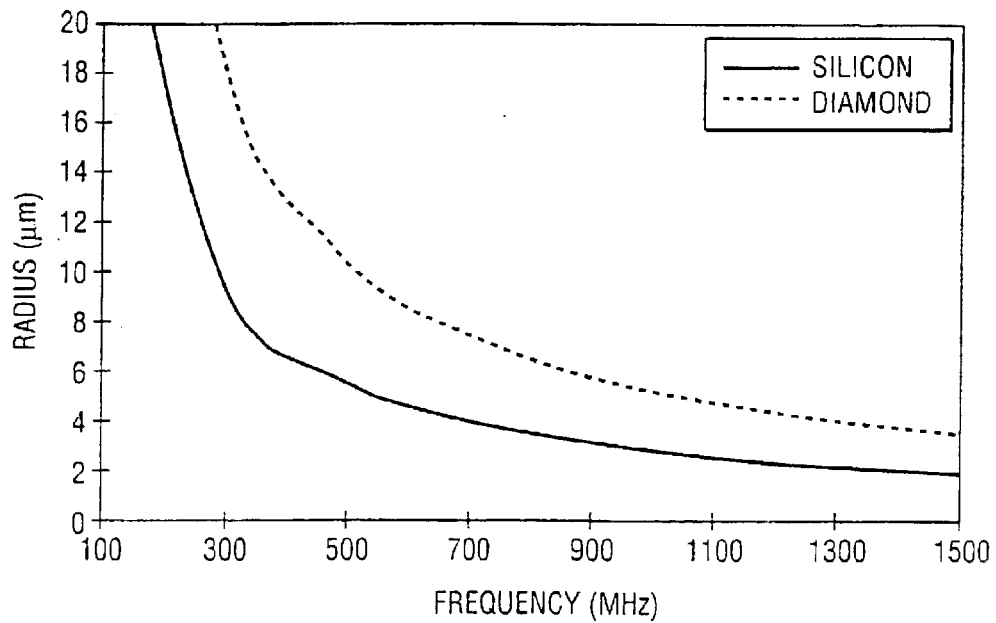
FIG. 2 is a graph of predicted resonant frequency versus radius for radial mode disk resonators in both polysilicon and polydiamond.

The plot in FIG. 2 shows the predicted resonant frequency as a function of radius for both polysilicon and polydiamond as the structural material of the disk 12 for first mode resonances. Although it is only a second order effect, the thickness of the structural material will also influence the frequency but only at high thickness to radius ratios (>1).

Figure 3:
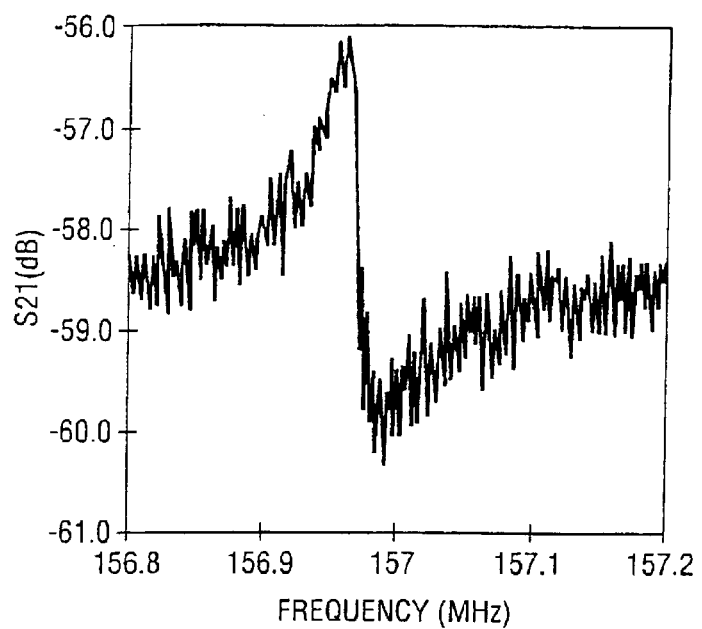
FIG. 3 is a graph illustrating measured frequency spectrum of a 157 MHz disk resonator.

Silicon disk resonator devices with plated gold electrodes have been fabricated and tested. The resonators had designed frequencies from approximately 60 MHZ to 500 MHZ. A plot in FIG. 3 is a measured spectrum of a 157 MHZ resonator, showing that the devices do indeed resonate in this configuration.

Although the preferred embodiment employs a center anchored, radial contour mode (moving only within the plane of the disk), one-port design, other embodiments are possible. A two-port variation of the preferred embodiment is obtained by splitting the electrode structure 20 into an even number of smaller electrodes, placed symmetrically about the disk 12. Then, alternating electrodes are connected together for input and output ports. In other words, if the electrodes are consecutively numbered around the perimeter, all of the even numbered electrodes would be connected to form an input drive electrode structure, while all of the odd numbered electrodes would be connected to form an output sense electrode structure. The body of the resonator would then be connected directly to $V_p$.

One can also excite many other types of modes with generalized electrode configuration (e.g., wine-glass modes). Which mode is excited depends to a good extent on the frequency of the excitation.

In addition, other mode shapes are possible, such as other contour modes which add more nodal points or nodal diameters. Each different configuration favors different electrode positioning in order to ensure driving the correct mode shape, as well as different anchor locations at nodal points to promote high-Q.

For example, FIG. 5 shows nodes 50 and an anti-node portion 52 where there is most of the motion of a higher order disk 53. FIG. 6 shows electrodes 54 on a substrate 56 for sensing motion at the outer rim of the disk 53. Inner and outer electrodes 58 and 60, respectively, are positioned to sense motion of fins 62 which project upwardly from the anti-node portion 52 of the disk 53 (shown positioned closer to the rim of the disk 53 than shown in FIG. 5 for purposes of illustration). Rather than the electrodes 58 and 60, mechanical links may be used to obtain the output from the anti-node. FIG. 6 shows the disk 53 levitated above the substrate 56 without the need for a mechanical support. Such levitation can be achieved either electrically or magnetically as previously noted.

Figure 11A:
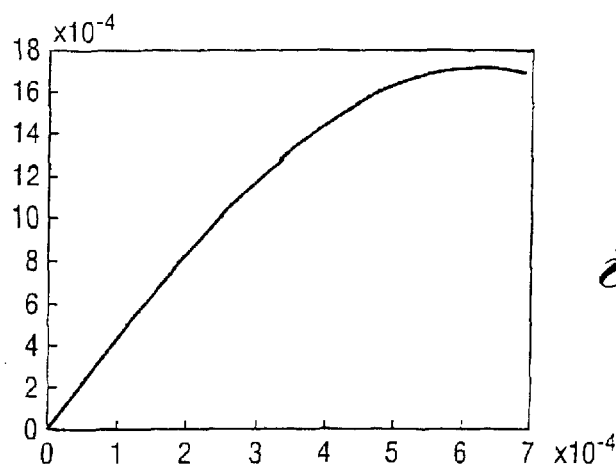
FIGS. 11a–11c are graphs of displacement versus radial coordinates for first, second and third modes, respectively, of a disk-shaped resonator of the present invention.
Figure 11B:
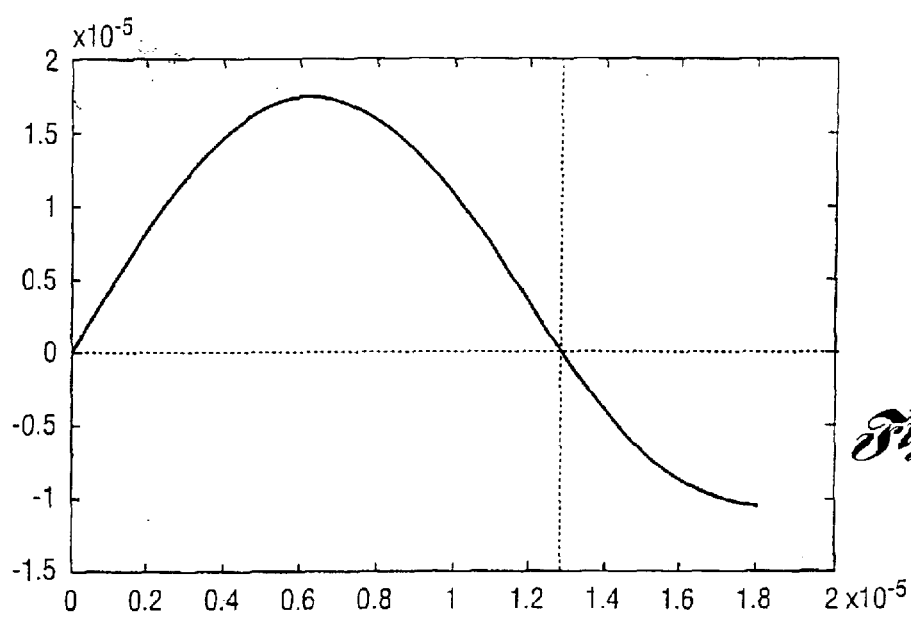
Figure 11C:
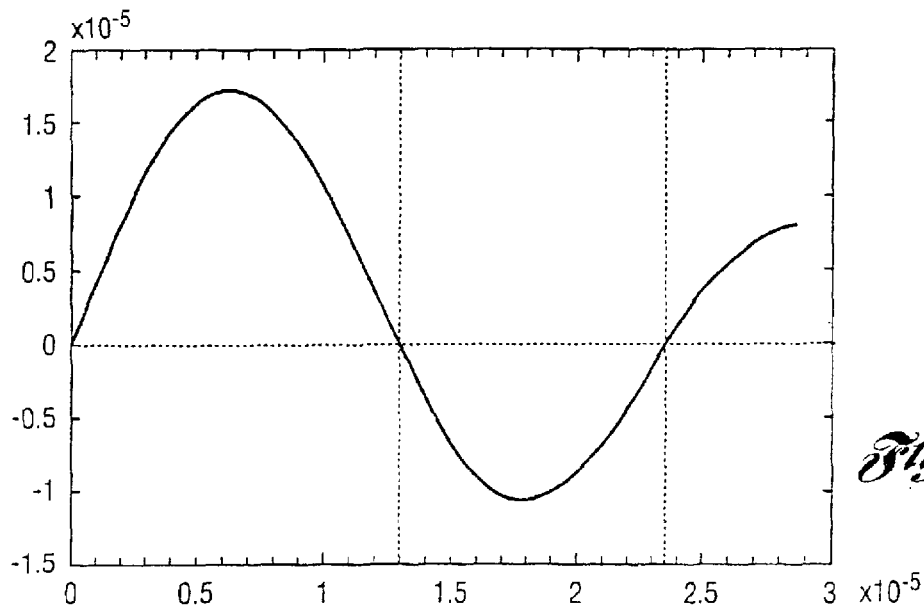

FIGS. 11a–11c are graphs wherein their maximums and the minimums represent the radii at which anti-nodes (i.e., areas of maximum displacement) occur for first, second and third modes of a disk resonator).

It is even possible to use the disks in flexural modes which require electrodes positioned beneath the structure, rather than to the sides. The invention covers not only the lateral contour modes of a disk, but flexural and other modes as well.

Figure 4A:
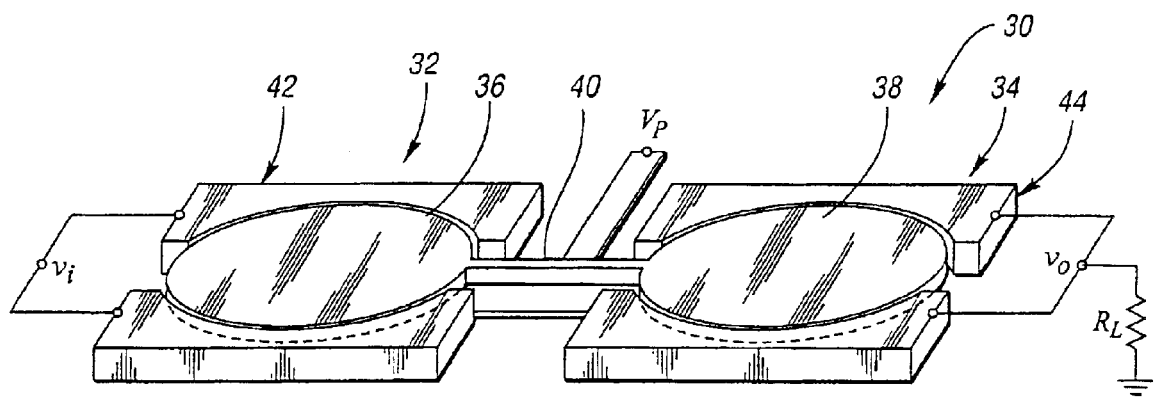
FIG. 4a is a combined electrical and perspective schematic view of a mechanically-coupled, two resonator, bandpass filter of the present invention.

One target application for disk resonators is the construction of micromechanical filters. FIG. 4a depicts a possible mechanically-coupled, two resonator, bandpass filter device, generally indicated at 30. The device 30 includes two mechanically coupled disk-shaped resonators, generally indicated at 32 and 34. The bodies or disks 36 and 38 of both resonators 32 and 34, respectively, are connected together by an extensional mode coupling spring or beam 40 and directly to the bias $V_p$. An input signal, $V_i$, applied to the first resonator 32 through an input electrode, generally indicated at 42, causes the first resonator 32 to begin vibrating. The extensional mode spring 40, which operates by expanding and contracting along its length, couples this motion to the second or output resonator 34, forcing it to move. The motion of the output resonator 34 induces a current in an output electrode, generally indicated at 44, which can be sensed in $R_L$.

Figure 4B:
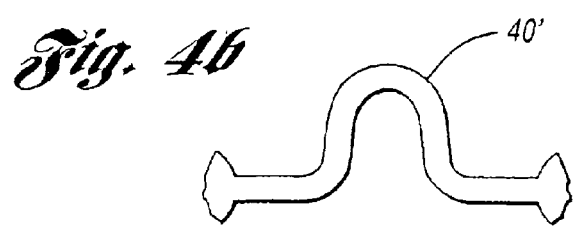
FIG. 4b is a top plan schematic view, partially broken away, of a flexural-mode "U" coupler for coupling disk-shaped resonators together.

FIG. 4b shows a "U"-shaped coupling spring 40' which can replace the beam 40 of FIG. 4a. Such a coupling spring is shown in U.S. Pat. No. 5,839,062 at reference numeral 104.

Rather than the single peak induced by a single resonator, the resulting frequency spectrum ($v_o/v_i$) has two peaks in its response which can be flattened into a bandpass filter spectrum via proper termination (adjustment of the source resistance driving $v_i$ and the load resistance $R_L$). A larger number of resonators results in a more ideal bandpass filter, and this structure can be expanded to n resonators generating n peaks in the spectrum by coupling longer chains of disks in the same manner. Although the extensional mode spring 40 is the easiest to design, other complex spring designs are also possible.

"Bridged" filters can be conveniently made using disk resonators. Bridged filters are obtained when not only adjacent resonators are connected, but also non-adjacent resonators are connected, as well. As shown in FIG. 9, the bridged filter of FIG. 9 includes an input disk resonator 80, an output disk resonator 82 and a middle resonator 84. Electrodes 86, 88 and 90 are provided for the resonators 80, 82 and 84, respectively. Adjacent couplers 92 and 94 interconnect the resonators 80 and 84, and 84 and 82, respectively. A non-adjacent coupler 96 interconnects the resonators 80 and 82.

Benefits accruing to the invention are numerous. For example, the main advantages and contributions of this invention include:

(i) Disk resonators can achieve frequency ranges from less than 50 MHz to well into the GHz range, making them viable alternatives to discrete components in RF-sub-systems;

(ii) Large size of the device relative to other micromechanical devices leads to a large electromechanical coupling coefficient in electrostatically driven devices which makes them easier to integrate into existing systems;

(iii) Large effective mass and stiffness enables disk resonators to handle higher power than other micromechanical devices, increasing dynamic range and decreasing distortion;

(iv) Disk resonators can be mechanically coupled using extensional mode springs or other mechanical spring types in order to produce integrated micromechanical filters;

(v) Symmetry of disk resonators allows more flexible coupling schemes, such as non-adjacent resonator coupling;

(vi) Disk resonators may also be electrically coupled to produce integrable filters;

(vii) The small size of micromechanical resonators allows for many devices to be used in parallel in order to even further improve power handling;

(viii) Small size also enables new architectures which use many small, high-Q components to obtain lower power consumption in transceivers to enhance robustness, and to enable improved capabilities (e.g., multi-band reconfigurability); and (ix) Integrated resonators have the potential to lower manufacturing costs over the long run by eliminating the need for many off-chip components, reducing circuit board area and the amount of off-chip RF routing.

The disk-shaped, radial-contour mode, micromechanical resonator is capable of reaching frequencies well past GHz, with high-Q, high dynamic range, and high power handling capability, and with possibilities for extremely flexible positioning of input/output ports (both electrical and mechanical). The resonator is frequency tunable via applied voltages (through its voltage-dependent electrical spring stiffness), and thus, rendered useful for high-Q voltage-controlled oscillator applications.

Filters such as the filter of FIG. 4, are made by coupling the disks either mechanically or electrically are possible as well.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micromechanical resonator device having at least one mode shape, the device comprising:

a substrate;

a resonator disposed above the substrate and having a disk-shaped surface wherein the at least one mode shape involves axial, flexural or contour modification of the disk-shaped surface at resonance; and a support structure anchored to the substrate to support the resonator above the substrate wherein both the resonator and the support structure are dimensioned and positioned relative to one another so that the resonator is substantially isolated during vibration thereof wherein energy losses to the substrate are substantially eliminated and wherein the resonator device is a high-Q resonator device.

2. The device as claimed in claim 1, wherein the resonator is supported above the substrate at one or more discrete locations on the resonator.

3. The device as claimed in claim 1, wherein the support structure includes an anchor that supports the resonator above the substrate.

4. The device as claimed in claim 3, wherein the support structure includes a further anchor.

5. The device as claimed in claim 3, wherein the resonator is center-anchored to the substrate by the anchor.

6. A micromechanical resonator device having at least one mode shape, the device comprising:
   a substrate;
   a resonator disposed above the substrate and having a disk-shaped surface wherein the at least one mode shape involves axial, flexural or contour modification of the disk-shaped surface at resonance; and
   a drive electrode structure formed on the substrate at a position to allow electrostatic excitation of the resonator so that the resonator is driven in the at least one mode shape wherein the resonator and the drive electrode structure define a capacitive gap therebetween and wherein the capacitive gap is a sub-micron, lateral, capacitive gap.

7. A micromechanical resonator device having at least one mode shape, the device comprising:
   a substrate;
   a resonator disposed above the substrate and having at least one nodal point;
   a disk-shaped surface wherein the at least one mode shape involves axial, flexural or contour modification of the disk-shaped surface at resonance wherein the at least one nodal point corresponds to a center of the resonator; and
   a support structure to support the resonator wherein the support structure is a single anchor positioned at the center of the resonator.

8. A micromechanical resonator device having at least one mode shape, the device comprising:
   a substrate;
   a resonator disposed above the substrate and having a disk-shaped surface wherein the at least one mode shape involves axial, flexural or contour modification of the disk-shaped surface at resonance; and
   a drive electrode structure formed on the substrate at a position to allow electrostatic excitation of the resonator so that the resonator is driven in the at least one mode shape wherein the resonator and the drive electrode structure define a capacitive gap therebetween and wherein the drive electrode structure is positioned beneath the resonator and wherein the at least one mode shape includes a flexural mode shape.

9. A micromechanical resonator device having at least one mode shape, the device comprising:
   a substrate; and
   a resonator disposed above the substrate and having a disk-shaped surface wherein the at least one mode shape involves axial, flexural or contour modification of the disk-shaped surface at resonance and wherein the device is diamond-based.

10. The device as claimed in claim 9, further comprising a support structure anchored to the substrate to support the resonator above the substrate wherein both the resonator and the support structure are dimensioned and positioned relative to one another so that the resonator is substantially isolated during vibration thereof wherein energy losses to the substrate are substantially eliminated and wherein the resonator device is a high-Q resonator device.

11. The device as claimed in claim 9, wherein the at least one mode shape includes a radial-contour mode shape.

12. The device as claimed in claim 9, wherein the at least one mode shape includes a flexural mode shape.

13. The device as claimed in claim 9, further comprising a drive electrode structure formed on the substrate at a position to allow electrostatic excitation of the resonator so that the resonator is driven in the at least one mode shape and wherein the resonator and the drive electrode structure define a capacitive gap therebetween.

14. The device as claimed in claim 13, wherein the drive electrode structure is disposed about a periphery of the resonator and wherein the at least one mode shape includes a radial-contour mode shape.

15. The device as claimed in claim 14, wherein the drive electrode structure includes a plurality of split electrodes.

16. The device as claimed in claim 13, further comprising a sense electrode structure formed on the substrate at a position to sense output current based on motion of the resonator.

17. The device as claimed in claim 16, wherein the drive electrode structure includes a plurality of separate input drive electrodes and the sense electrode structure includes a plurality of separate output sense electrodes.

18. A micromechanical device comprising:
   a substrate;
   an input resonator disposed above the substrate and having at least one mode shape and a disk-shaped surface;
   an output resonator disposed above the substrate and coupled to the input resonator and having at least one mode shape and a disk-shaped surface wherein the at least one mode shape of at least one of the resonators involves axial, flexural or contour modification of the disk-shaped surface at resonance; and
   a coupling spring for mechanically coupling the resonators together.

19. The device as claimed in claim 18, further comprising support structures anchored to the substrate to support the input and output resonators above the substrate.

20. The device as claimed in claim 18, wherein the micromechanical device is a filter.

21. The device as claimed in claim 18, wherein the device is a bandpass filter.

22. The device as claimed in claim 18, further comprising a drive electrode structure formed on the substrate at a position to allow electrostatic excitation of the input resonator and a sense electrode structure formed on the substrate at a position to sense output current based on motion of the output resonator.

23. A micromechanical device comprising:
   a substrate;
   an input resonator disposed above the substrate and having at least one mode shape and a disk-shaped surface;
   an output resonator disposed above the substrate and coupled to the input resonator and having at least one mode shape and a disk-shaped surface wherein the at least one mode shape of at least one of the resonators involves axial, flexural or contour modification of the disk-shaped surface at resonance;

an intermediate resonator disposed above the substrate and coupled to the input and output resonators and having at least one mode shape;

a drive electrode structure formed on the substrate at a position to allow electrostatic excitation of the input resonator;

a sense electrode structure formed on the substrate at a position to sense output current based on motion of the output resonator; and an intermediate electrode structure formed on the substrate at a position for enhanced access to a response of the device.

24. A micromechanical device comprising:

a substrate;

an input resonator disposed above the substrate and having at least one mode shape and a disk-shaped surface; and an output resonator disposed above the substrate and coupled to the input resonator and having at least one mode shape and a disk-shaped surface wherein the at least one mode shape of at least one of the resonators involves axial, flexural or contour modification of the disk-shaped surface at resonance and wherein the device is a mixer.

25. A micromechanical resonator device having at least one mode shape, the device comprising:

a substrate;

a resonator disposed above the substrate and having a disk-shaped surface wherein the at least one mode shape involves axial, flexural or contour modification of the disk-shaped surface at resonance, the resonator having at least one anti-nodal portion where the resonator experiences the most displacement when driven;

sensing means for sensing motion of the anti-nodal portion, the sensing means including at least one projection projecting from the anti-nodal portion to move therewith; and means coupled to the at least one projection to provide an output representation of motion of the anti-nodal portion.

26. The device as claimed in claim 25, wherein the means includes at least one electrode structure.

27. A micromechanical resonator device having at least one mode shape, the device comprising:

a substrate;

a resonator disposed above the substrate and having at least one mode shape and a disk-shaped surface wherein the at least one mode shape involves axial, flexural or contour modification of the disk-shaped surface at resonance; and a single electrode structure formed on the substrate at a position to allow electrostatic excitation of the resonator and to sense output current based on motion of the resonator.

28. A micromechanical resonator device having at least one mode shape, the device comprising:

a substrate; and a resonator disposed above the substrate and having a disk-shaped surface wherein the at least one mode shape includes a wine-glass mode that involves modification of the disk-shaped surface at resonance.

* * * * *